United States Patent
Wang

(10) Patent No.: US 12,040,352 B2
(45) Date of Patent: Jul. 16, 2024

(54) SEMICONDUCTOR STRUCTURE

(71) Applicant: CHANGXIN MEMORY TECHNOLOGIES, INC., Hefei (CN)

(72) Inventor: Lin Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 426 days.

(21) Appl. No.: 17/446,293

(22) Filed: Aug. 28, 2021

(65) Prior Publication Data

US 2022/0238428 A1    Jul. 28, 2022

Related U.S. Application Data

(63) Continuation of application No. PCT/CN2021/103636, filed on Jun. 30, 2021.

(30) Foreign Application Priority Data

Jan. 28, 2021 (CN) .......................... 202110116929.0

(51) Int. Cl.
*H01L 27/08*   (2006.01)
*H01L 49/02*   (2006.01)

(52) U.S. Cl.
CPC .......... *H01L 28/40* (2013.01); *H01L 27/0805* (2013.01)

(58) Field of Classification Search
CPC .................. H01L 27/0805; H01L 28/40
See application file for complete search history.

(56) References Cited

U.S. PATENT DOCUMENTS

| | | |
|---|---|---|
| 4,630,088 A | 12/1986 | Ogura |
| 7,317,221 B2 | 1/2008 | Chang |
| 7,358,555 B2 | 4/2008 | Iwamatsu |
| 8,994,145 B2 | 3/2015 | Sato |
| 10,789,992 B2 | 9/2020 | Lin et al. |
| 10,861,841 B2 | 12/2020 | Tseng et al. |
| 2002/0113287 A1 | 8/2002 | Lee |
| 2005/0121744 A1 | 6/2005 | Chang |
| 2006/0237726 A1 | 10/2006 | Iwamatsu et al. |
| 2012/0161217 A1* | 6/2012 | Sato ................... H01L 29/8611 257/532 |
| 2020/0013434 A1 | 1/2020 | Lin et al. |

(Continued)

FOREIGN PATENT DOCUMENTS

| | | |
|---|---|---|
| CN | 1698189 A | 11/2005 |
| CN | 105575959 A | 5/2016 |
| CN | 103794599 B | 11/2017 |

(Continued)

OTHER PUBLICATIONS

First Office Action of Chinese Patent Application No. 202110116929.0, issued on Jun. 1, 2022.

(Continued)

*Primary Examiner* — Daniel P Shook
(74) *Attorney, Agent, or Firm* — Syncoda LLC; Feng Ma

(57) ABSTRACT

A semiconductor structure includes: a pad structure disposed above a substrate; and a capacitor structure which is disposed between the substrate and the pad structure, is arranged to be opposite to the pad structure, and includes at least two capacitor units connected in parallel and spaced apart from each other, each of the capacitor units includes at least one capacitor device.

18 Claims, 8 Drawing Sheets

(56) References Cited

U.S. PATENT DOCUMENTS

2020/0105738 A1  4/2020  Tseng et al.
2021/0091065 A1  3/2021  Tseng et al.

FOREIGN PATENT DOCUMENTS

| CN | 110970387 A | 4/2020 |
| CN | 112908994 A | 6/2021 |
| JP | 2012138513 A | 7/2012 |
| JP | 2021052160 A | 4/2021 |

OTHER PUBLICATIONS

First Office Action of the Japanese application No. 2022-543500, issued on Sep. 12, 2023, 5 pages with English translation.

* cited by examiner

SEMICONDUCTOR STRUCTURE

CROSS-REFERENCE TO RELATED APPLICATIONS

This is a continuation of International Patent Application No. PCT/CN2021/103636 filed on Jun. 30, 2021, which claims priority to Chinese Patent Application No. 202110116929.0 filed on Jan. 28, 2021. The disclosures of these applications are hereby incorporated by reference in their entirety.

BACKGROUND

A capacitor can store energy, and is connected between a power end and a grounding end in parallel. Fluctuation of a voltage generated by the power end in an operation process of a circuit becomes gentle, and the operation performance of the power end is stable. Therefore, in circuit designs, a lot of capacitor structures are usually required, to enhance the stability of the power end. Not only the power end, the signal end may also be provided with a capacitor when high-frequency noise is removed at the signal end.

SUMMARY

The disclosure relates generally to the technical field of semiconductors, and more specifically to a semiconductor structure.

According to some embodiments, a semiconductor chip is provided.

A semiconductor structure may include a pad structure and a capacitor structure.

The pad structure is disposed above a substrate.

The capacitor structure is disposed between the substrate and the pad structure, and arranged to be opposite to the pad structure, and includes at least two capacitor units which are connected in parallel and spaced apart from each other. Each of the capacitor units includes at least one capacitor device.

BRIEF DESCRIPTION OF THE DRAWINGS

In order to describe the technical solutions in the embodiments of the disclosure or a conventional art more clearly, the drawings required to be used in descriptions about the embodiments or the conventional art are simply introduced below. It is apparent that the drawings described below are only some embodiments of the disclosure. Other drawings may further be obtained by those of ordinary skilled in the art according to these drawings without creative work.

DETAILED DESCRIPTION

Figure 1:
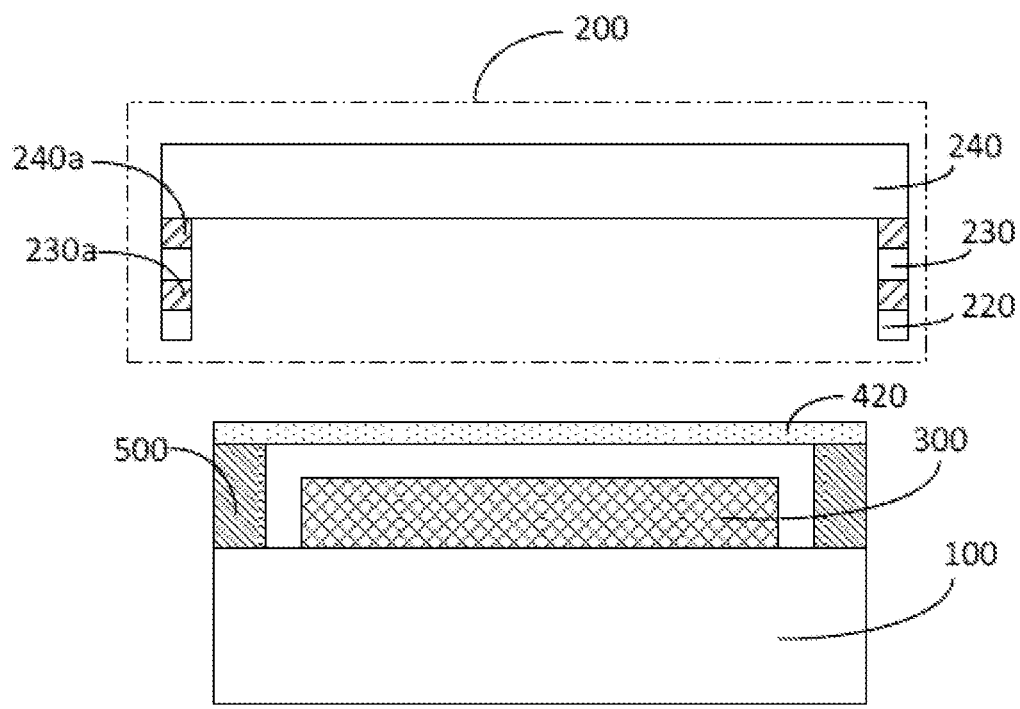
FIG. 1 is a schematic sectional diagram of a semiconductor structure provided in an embodiment.

In order to make the disclosure convenient to understand, the disclosure will be described more comprehensively below with reference to the drawings. The drawings show preferred embodiments of the disclosure. However, the disclosure may be implemented in various forms and is not limited to the embodiments described herein. Instead, these embodiments are provided to make the contents disclosed in the disclosure understood more thoroughly and comprehensively.

Unless otherwise defined, all technical and scientific terms used herein have the same meanings as commonly understood by those skilled in the art that the disclosure belongs to. Herein, terms used in the description of the disclosure are used only for describing specific embodiments and not intended to limit the disclosure.

It is to be understood that description that an element or layer is "above", "adjacent to", "connected to", or "coupled to" another element or layer may refer to that the element or layer is directly above, adjacent to, connected to or coupled to the other element or layer, or an intermediate element or layer may exist therebetween. On the contrary, description that an element is "directly on", "directly adjacent to", "directly connected to" or "directly coupled to" another element or layer refers to that there is no intermediate element or layer therebetween. It is to be understood that, although various elements, components, regions, layers, doping types and/or parts may be described with terms first, second, third, etc., these elements, components, regions, layers, doping types and/or parts should not be limited to these terms. These terms are used only to distinguish one element, component, region, layer, doping type or part from another element, component, region, layer, doping type or part. Therefore, a first element, component, region, layer, doping type or part discussed below may represent a second element, component, region, layer or part without departing from the teaching of the disclosure. For example, a first conductive part may become a second conductive part. Similarly, the second conductive part may become a first doping type.

Spatially relational terms such as "below", "under", "lower", "beneath", "above", and "upper" may be used herein for describing a relationship between one element or feature and another element or feature illustrated in the drawings. It is to be understood that, in addition to the orientation shown in the drawings, the spatially relational terms further include different orientations of devices in use and operation. For example, if the device in the drawings is turned over, elements or features described as being "under" or "beneath" or "below" other elements or features will be oriented to be "on" the other elements or features. Therefore, the exemplary terms "under" and "below" may include both upper and lower orientations. Moreover, the device may include other orientation (such as rotation by 90 degrees or in other orientations) and the spatial descriptors used herein may be interpreted accordingly.

As used herein, singular forms "a/an", "one", and "the" may include the plural forms, unless otherwise specified types in the context. It is also to be understood that, when terms "composed of" and/or "including" are used in this specification, the presence of the features, integers, steps, operations, elements and/or components may be determined, but the presence or addition of one or more other features, integers, steps, operations, elements, components, and/or groups is not exclusive. Also, as used herein, term "and/or" includes any and all combinations of the related listed items.

In a typical semiconductor chip, a capacitor structure is usually added in a spare space of the chip, to stabilize a power end or a signal end in the chip. In this way, however, the area of the chip is increased, thereby increasing the product cost.

Figure 2:
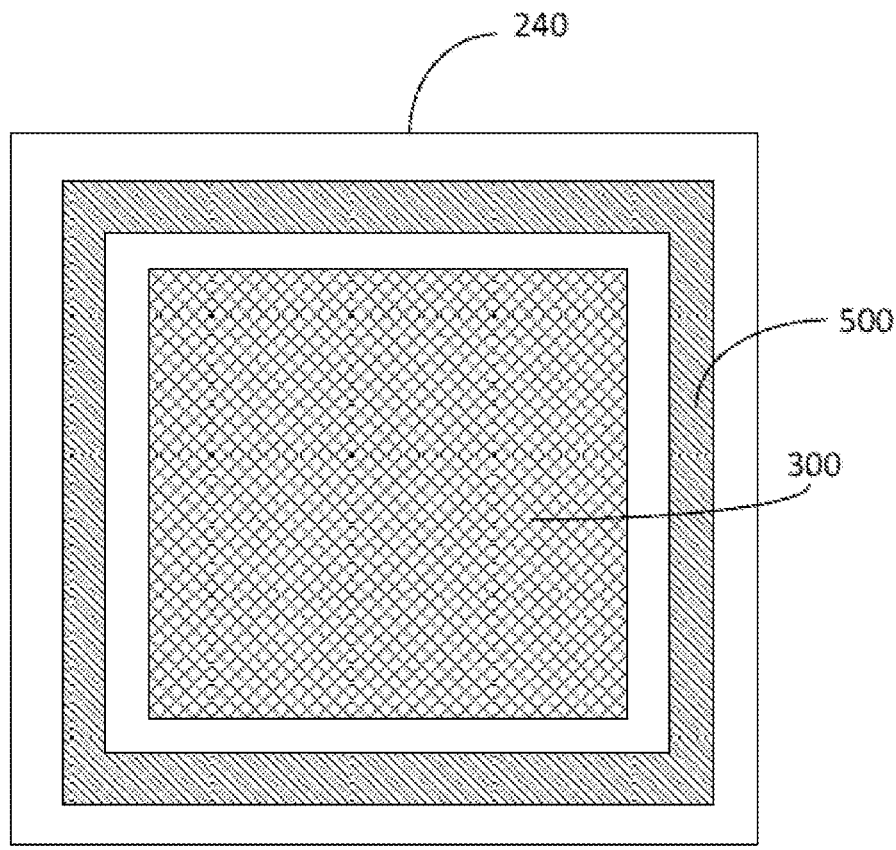
FIG. 2 is a schematic plan diagram of a semiconductor structure provided in an embodiment.

Referring to FIG. 1 and FIG. 2, a semiconductor structure is provided according to an embodiment, which includes a substrate 100, a pad structure 200 and a capacitor structure 300. Specifically, the semiconductor structure can be an upper structure on a semiconductor chip.

The substrate 100 can be, but be not limited to, a silicon substrate.

The pad structure 200 is disposed above the substrate 100, and can be for example, a power pad or a signal pad or a grounding pad. The specific type of the pad structure 200 is not limited.

Specifically, when the pad structure 200 is the power pad, the power pad can be electrically connected with a packaging substrate by making a lead, to acquire a power voltage (such as VDDQ, VPP and VDD). When the pad structure 200 is the signal pad, the signal pad can be electrically connected with the packaging substrate by making a lead, to acquire a control signal (such as a Chip Select (CS) signal and a RESET signal). When the pad structure 200 is the grounding pad, the grounding pad can be electrically connected with the packaging substrate by making a lead, to being connected in parallel to be grounded.

The capacitor structure 300 is connected between a power end and a grounding end of a chip circuit in parallel, and configured to enable fluctuation of 1 voltage generated by a power supply in an operation process of a circuit to be gentle and to remove high-frequency noise on the power supply, to stabilize the operation performance of the power supply.

Specifically, the capacitor structure 300 is disposed between the substrate 100 and the pad structure 200, and is arranged to be opposite to the pad structure 200. Therefore, the capacitor structure 300 is disposed below the pad structure 200.

Therefore, a utilization rate of a region where the pad structure 200 is disposed can be effectively improved in the embodiment. Compared with a traditional disposing manner that a capacitor structure is disposed in a spare space of a chip, the embodiment can effectively prevent from increasing the area of the chip due to disposing of the capacitor structure.

The above semiconductor structure may effectively improve a utilization rate of a region where the pad structure is disposed. Compared with a traditional disposing manner that a capacitor structure is disposed in a spare space of a chip, the disclosure can effectively prevent from increasing the area of the chip due to disposing of the capacitor structure. Also, when the pad structure has a large size, the size of each of the capacitor units is small in the disclosure. In a manufacturing process, various related films of the capacitor unit having the small size can be subjected to uniform film formation easily. Therefore, in the disclosure, the film formation quality of the various related films can be improved, thereby improving the reliability of the capacitor structure, and stabilizing the power voltage of a related power supply.

Figure 3:
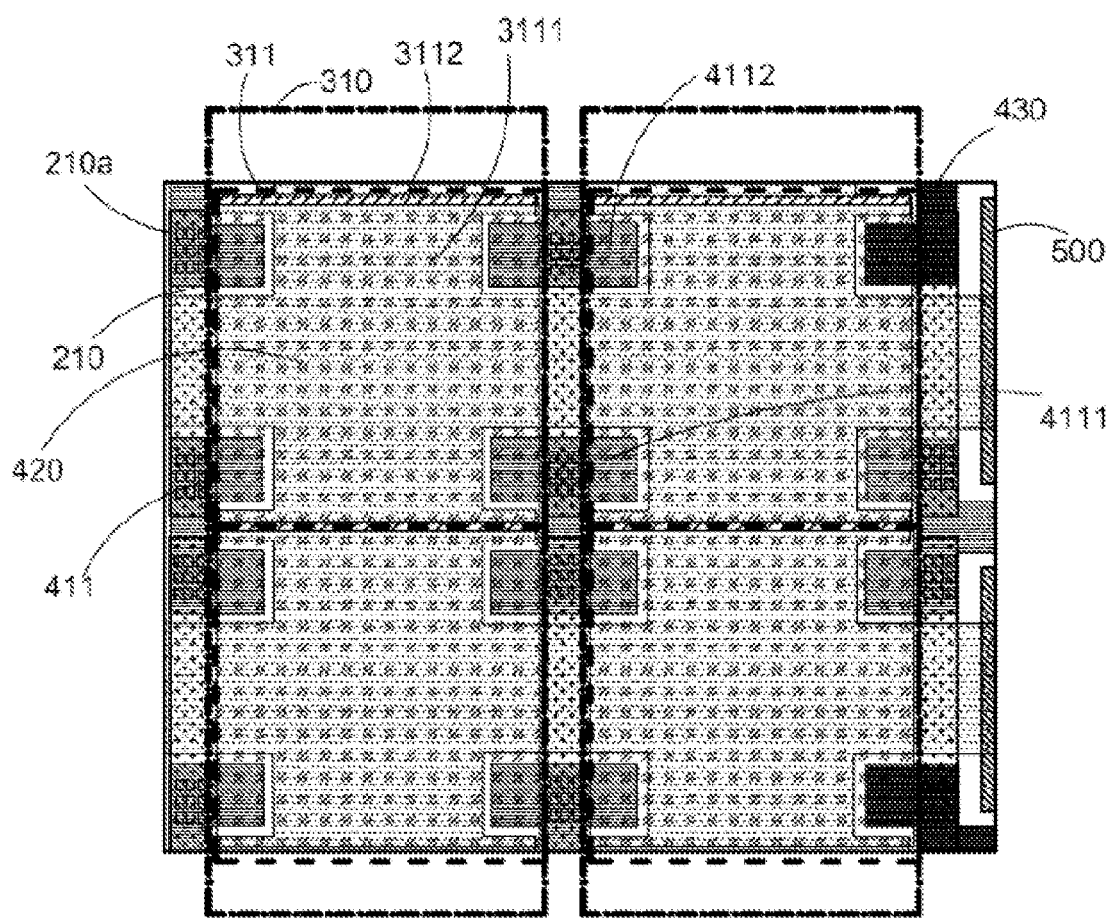
FIG. 3 is a schematic diagram of a local structure of a semiconductor structure provided in an embodiment.

Also, referring to FIG. 3, the capacitor structure 300 in the embodiment may include at least two capacitor units 310 connected in parallel and disposed spaced apart from each other. Each of the capacitor units may include one or more capacitor devices 311.

Therefore, when the pad structure 200 has a large size, the size of each of the capacitor units 310 is small. In a manufacturing process, various related films of the capacitor unit having the small size can be subjected to uniform film formation easily. Therefore, in the disclosure, the film formation quality of the various related films can be improved, thereby improving the reliability of the capacitor structure, and stabilizing the power voltage of a related power supply.

It can be understood that the related power supply here refers to a power end to which the capacitor structure 300 is connected.

In an embodiment, orthographic projection of the capacitor structure 300 on the substrate 100 is located within the orthographic projection of the pad structure 200 on the substrate 100.

In this case, the capacitor structure 300 is completely located below the pad structure 200, thereby utilizing the utilization rate of a region where the pad structure 200 is disposed more effectively. Therefore, the area of the chip is completely not influenced in a case of disposing the capacitor structure 300, thereby facilitating miniaturization of the chip.

In practice, the disclosure is not limited thereto. The orthographic projection of the capacitor structure 300 on the substrate 100 may also be partly located outside the orthographic projection of the pad structure 200 on the substrate 100. Alternatively, the orthographic projection of the capacitor structure 300 on the substrate 100 may coincide with the orthographic projection of the pad structure 200 on the substrate 100.

In an embodiment, the center of the orthographic projection of the capacitor structure 300 on the substrate 100 coincides with the center of the orthographic projection of the pad structure 200 on the substrate 100.

At this time, the capacitor structure 300 is just opposite to the pad structure 200, so that the capacitor structure 300 has uniform performance at various positions.

It is to be noted that the center of the orthographic projection of the capacitor structure 300 on the substrate 100 may not coincide with the center of the orthographic projection of the pad structure 200 on the substrate 100 in the disclosure, which is not limited in the disclosure.

Figure 4:
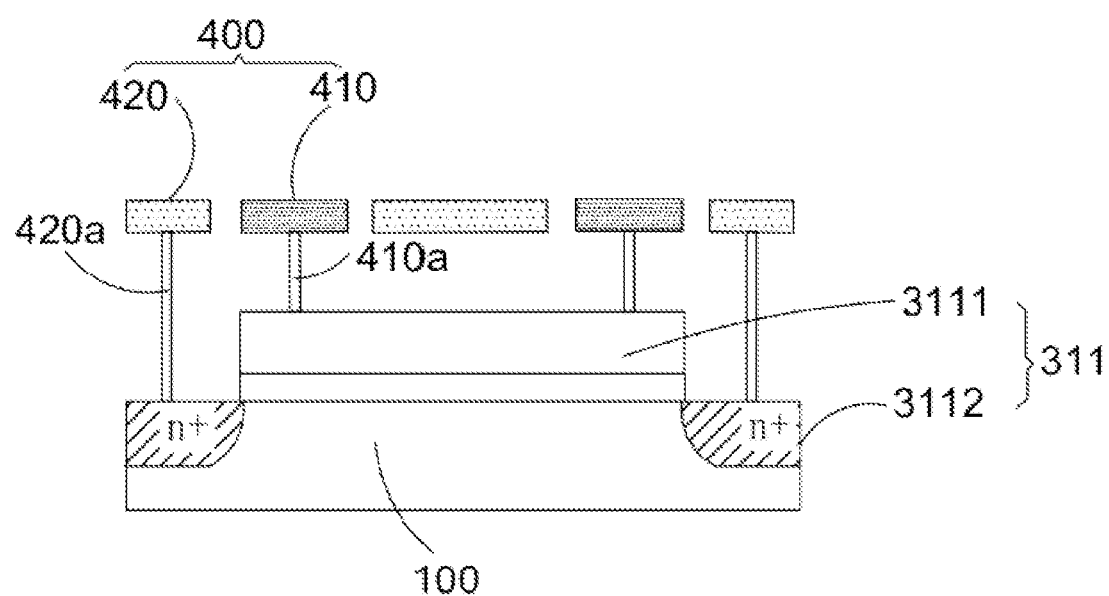
FIG. 4 is a schematic diagram of electrical connection between a conductive layer and a capacitor device provided in an embodiment.

In an embodiment, referring to FIG. 4, the capacitor device 311 in the capacitor unit 310 includes a first polar plate 3111 and a second polar plate 3112. The first polar plate 3111 and the second polar plate 3112 are arranged to be opposite with each other, to store charges.

Also, referring to FIG. 1, the semiconductor structure may further include a conductive layer 400. The conductive layer 400 may include a first conductive portion 410 and a second conductive portion 420. The first conductive portion 410 and the second conductive portion 420 are mutually insulated.

The first conductive portion 410 is electrically connected to the first polar plates 3111 of each of the capacitor devices 311, i.e., the first polar plate 3111 of the capacitor device 311 in each of the capacitor units 310 is electrically connected to the first conductive portion 410. Therefore, due to disposing of the first conductive portion 410, the first polar plates 3111 of the capacitor devices 311 in all of the capacitor units 310 are all electrically connected to the same circuit node.

Similarly, the second conductive portion 420 is electrically connected to the second polar plate 3112 of each of the capacitor devices 311, i.e., the second polar plate 3112 of the capacitor device 311 in each of the capacitor units 310 is electrically connected to the second conductive portion 420. Therefore, due to disposing of the second conductive portion 420, the second polar plates 3112 of the capacitor devices 311 in all of the capacitor units 310 are all electrically connected to the same circuit node.

Therefore, due to disposing of the conductive layer 400, the capacitor devices 311 in all of the capacitor units 310 can be conveniently and effectively connected in parallel, to form the capacitor structure 310.

Also, one of the first conductive portion 410 or the second conductive portion 420 is electrically connected to the power end, and the other is electrically connected to the grounding end. That is, the first conductive portion 410 is electrically connected to the power end in the chip circuit, and the second conductive portion 420 is electrically connected to the grounding end in the chip circuit. Alternatively, the second conductive portion 420 is electrically connected to the power end in the chip circuit, and the first conductive portion 410 is also electrically connected to the grounding end in the chip circuit.

In this way, the capacitor structure 310 formed by parallel connection of the capacitor devices 311 can be conveniently and effectively introduced into the chip circuit.

Figure 7:
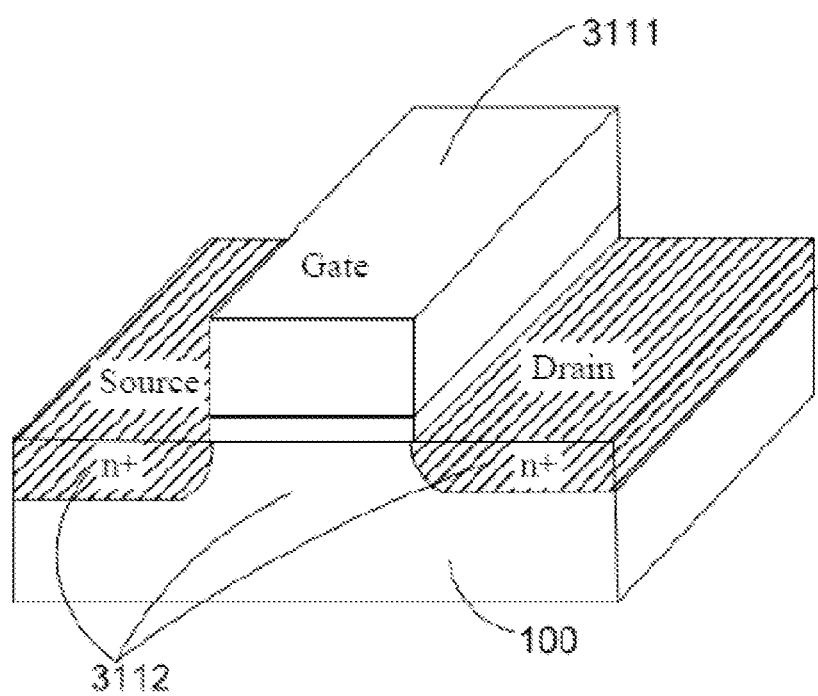
FIG. 7 is a schematic diagram of a capacitor of a transistor type.

Specifically, the capacitor device 311 can be a transistor-type capacitor, referring to FIG. 4 and FIG. 7, a gate of the transistor-type capacitor forms the first polar plate 3111 of the capacitor device, and a source and a drain of the transistor-type capacitor and corresponding parts of the substrate 100 form the second polar plate 3112 of the capacitor device 311.

In this way, the first polar plate 3111 (that is, the gate of the transistor-type capacitor) of each of the capacitor devices 311 can be electrically connected to the first conductive portion 410 via a first capacitor through hole 410a. The second polar plate 3112 (that is, the source and the drain of the transistor-type capacitor and the corresponding parts of the substrate 100) of each of the capacitor devices 311 can be electrically connected to the second conductive portion 420 via a second capacitor through hole 420a.

Also, the first conductive portion 410 can be electrically connected to the power end in the chip circuit, and the second conductive portion 420 can be electrically connected to the grounding end in the chip circuit.

When the capacitor device 311 can be a transistor-type capacitor, the gate of the transistor-type capacitor forms the second polar plate 3112 of the capacitor device, and the source and the drain of the transistor-type capacitor and the corresponding parts of the substrate 100 form the first polar plate 3111 of the capacitor device 311, which are not limited in the disclosure.

Alternatively, the capacitor device 311 may also be a capacitor of other types (such as a parallel-plate capacitor formed by two metal plates which are disposed to be opposite), which is not limited in the disclosure.

Figure 5:
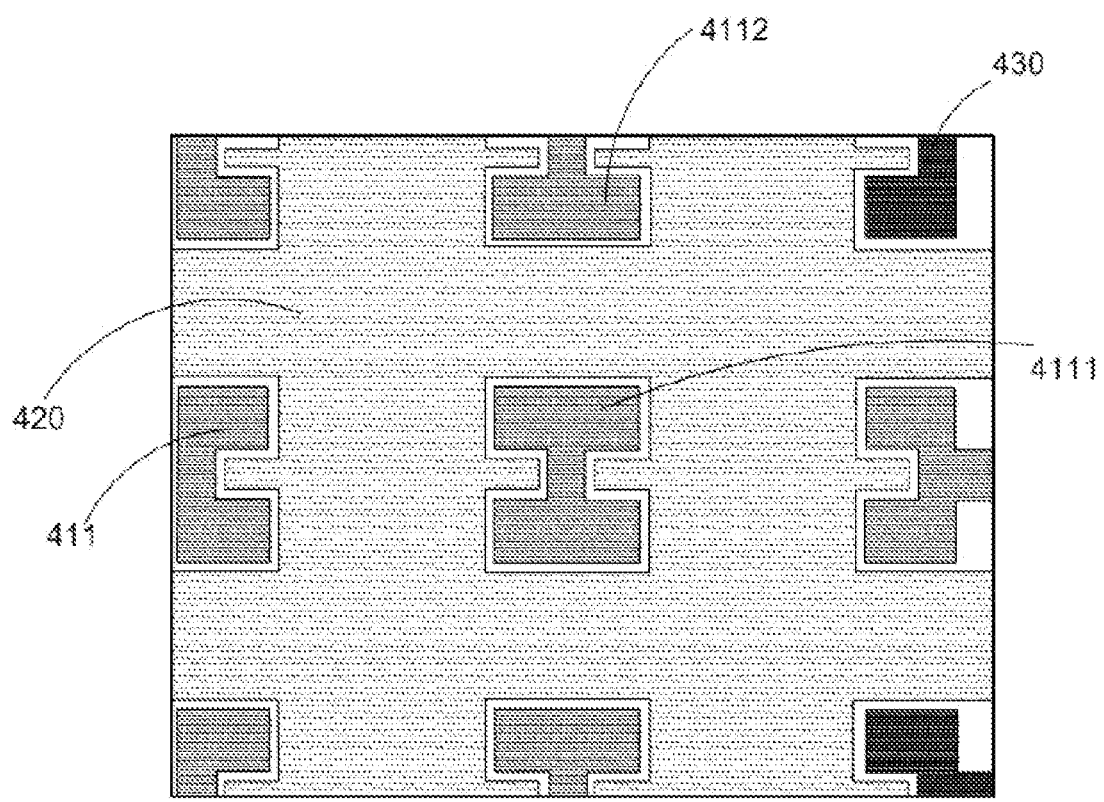
FIG. 5 is a schematic diagram of a conductive layer in FIG. 3.

In an embodiment, referring to FIG. 5 and FIG. 3, the second conductive portion 420 of the conductive layer 400 is in an integrated structure, and is disposed across the various capacitor devices 311 in the capacitor structure 300, so that the second polar plates 3112 of all of the capacitor devices 311 in the capacitor structure 300 can be electrically connected with the second conductive portion 420 via interconnected through holes.

The first conductive portion 410 is in a separated structure, and includes a plurality of sub-conductive portions 411 electrically connected. The sub-conductive portions 411 are disposed across the adjacent capacitor devices 311 in the capacitor structure 300, so that the first polar plate 3111 of the adjacent capacitor devices 311 can be electrically connected with the same sub-conductive portion 411 via interconnected through holes. Also, the sub-conductive portions 411 of the first conductive portion 410 are mutually connected electrically. Therefore, in this way, the first polar plates 3111 of all of the capacitor devices 311 in the capacitor structure 300 can be electrically connected together.

Also, orthographic projections of all of the sub-conductive parts 411 of the first conductive portion 410 on the substrate 100 are disposed spaced apart from orthographic projection of the second conductive portion 420 on the substrate 100. That is, the orthographic projection of the first conductive portion 410 is disposed spaced apart from the orthographic projection of the second conductive portion 420 on the substrate 100.

In this way, the first conductive portion 410 and the second conductive portion 420 can be formed synchronously and conveniently in a film formation process in the embodiment. Therefore, the process can be effectively simplified, and production efficiency can be increased.

Specifically, during the process, a conductive material layer can be formed at first, and then the conductive material layer is patterned, to form the second conductive portion 420 and the plurality of sub-conductive portions 411.

In practice, the first conductive portion 410 and the second conductive portion 420 may also be formed step by step in different film formation processes in the embodiment. In this way, orthographic projections of all of the sub-conductive portions 411 of the first conductive portion 410 on the substrate 100 are disposed spaced apart from orthographic projection of the second conductive portion 420 on the substrate 100.

It is to be noted that the orthographic projection of the first conductive portion 410 is disposed spaced apart from the orthographic projection of the second conductive part 420 on the substrate 100 in the embodiment, but the disclosure is not limited thereto.

For example, the first conductive portion 410 and the second conductive portion 420 can be formed step by step in some embodiments. In this way, the first conductive portion 410 and the second conductive portion 420 can be disposed to be in an integrated structure. In this case, the orthographic projection of the first conductive part 410 on the substrate 100 and the orthographic projection of the second conductive part 420 on the substrate 100 may also completely or partly coincide with each other.

For another example, in some embodiments, the first conductive portion 410 and the second conductive portion 420 can be formed step by step. In this way, the orthographic projection of the first conductive portion 410 in the separated structure on the substrate 100 and the orthographic projection of the second conductive portion 420 in the integrated structure on the substrate 100 may also be mutually connected.

Moreover, in the embodiment, if the first conductive portion 410 in the separated structure of the conductive layer 400 is electrically connected to the power end, the second conductive part 420 in the integrated structure is electrically connected to the grounding end. Furthermore, when the semiconductor chip is provided with the plurality of semiconductor structures in the embodiment, the second conductive portions 420 of the conductive layers 200 of the plurality of semiconductor structures can be connected together to form an integrated structure.

In practice, when the semiconductor chip is provided with the plurality of semiconductor structures in the embodiment, the second conductive portions 420 of the conductive layers 200 of the plurality of semiconductor structures may also be disposed separately, and the second conductive portion 420 in each semiconductor structure is in an integrated structure.

Moreover, in the embodiment, the first conductive portion 410 in the separated structure may also be electrically connected to the power end, and the second conductive portion 420 in the integrated structure is electrically connected to the power end. Then, when the semiconductor chip is provided with the plurality of semiconductor structures in the embodiment, the conductive layers 200 of the plurality of semiconductor structures can be independently disposed.

In an embodiment, continuously referring to FIG. 3, on the basis of the above embodiments, each capacitor unit 310 includes at least two capacitor devices 311 disposed in parallel. All the capacitor devices 311 in the capacitor structure 300 are disposed in M-row N-column array, and both the M and the N are integers greater than or equal to 2.

Disposing the capacitor devices 311 in array can facilitate layout design of sub-conductive portions 411 of the first conductive portion 410 and the second conductive portion 420.

In the embodiment, referring to FIG. 3 and FIG. 5 at the same time, the sub-conductive portions 411 includes a first sub-portion 4111. The same first sub-portion 4111 is disposed across four capacitor devices 311 which are adjacent in pairs and distributed in a center-symmetrical manner. At this time, the same first sub-portion 4111 can be electrically connected to the four capacitor devices 311 at the same time, and provides power end signals for the four capacitor devices 311, to further provide the multi-function performance. As an example, the first sub-portion 4111 can be I-shaped.

At this time, furthermore, all of four corners of each capacitor device 311 can be electrically connected to the sub-conductive portion 411, so that each capacitor device 311 may obtain electrical signals stably and reliably.

It is to be understood that besides the first sub-portion 4111, the sub-conductive portion 411 may further include a second sub-portion 4112 only across the two adjacent capacitor devices 311. The second sub-portion 4112 can be disposed cross the two adjacent capacitor devices 311 disposed at the edge of the capacitor structure 300, and the first sub-portion 4111 can be disposed in an annular region formed by the first sub-portion 4112.

Also, the conductive layer 400 may also include a third conductive portion 430, which can be disposed above the capacitor structure 311 disposed in the corner, so as to be electrically connected to the capacitor structure 311 disposed in the corner.

Figure 6:
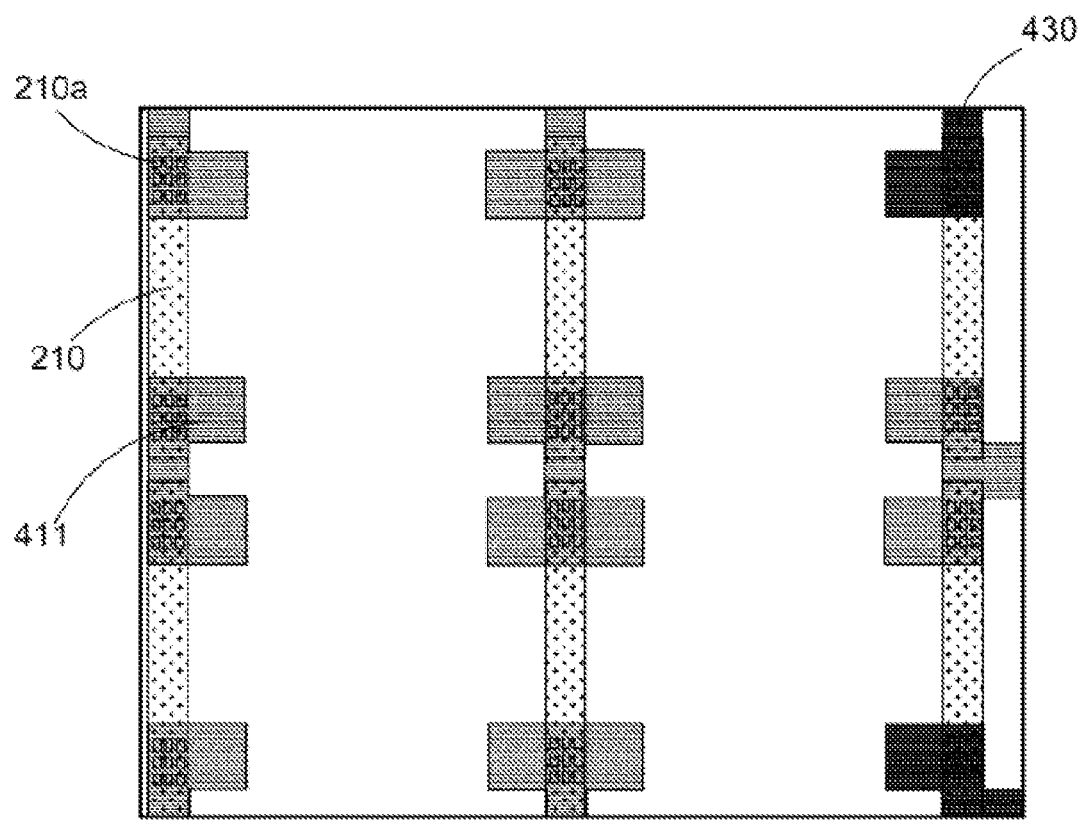
FIG. 6 is a schematic diagram of a first metal layer, a first conductive part and a third conductive part in FIG. 3.

In an embodiment, referring to FIG. 3 and FIG. 6, the pad structure 200 may include a first metal layer 210. One end of the first metal layer 210 is electrically connected to the power end. Moreover, the other end of the first metal layer 210 is electrically connected to the various sub-conductive portions 411 via a first through hole 210a.

By disposing the first metal layer 210, all the sub-conductive portions 411 can be connected together electrically simply and effectively, and are also electrically connected to the power end. In this case, the first conductive portion 410 in the separated structure is electrically connected to the power end, and the second conductive portion 420 in the integrated structure is electrically connected to the grounding end.

In an embodiment, similarly referring to FIG. 3 and FIG. 6, the pad structure 200 may include a first metal layer 210. One end of the first metal layer 210 is electrically connected to the grounding end. Moreover, the other end of the first metal layer 210 is electrically connected to the all of the sub-conductive portions 411 via a first through hole 210a.

By disposing the first metal layer 210, the various sub-conductive portions 411 can be electrically connected together simply and conveniently, and electrically connected to the grounding end. In this case, the first conductive portion 410 in the separated structure is electrically connected to the grounding end, and the second conductive portion 420 in the integrated structure is electrically connected to the power end.

In an embodiment, referring to FIG. 1, the pad structure 200 may further include a second metal layer 220, a third metal layer 230 and a fourth metal layer 240. The third metal layer 230 is connected with the second metal layer 220 via a third through hole 230a, and the fourth metal layer 240 is connected with the third metal layer 230 via a fourth through hole 240a.

By disposing the plurality of metal layers, mechanical strength of the pad structure 200 can be effectively improved, so that the pad structure 200 may not be damaged when being electrically connected to the packaging substrate through a wire bonding process.

Moreover, a shape of orthographic projection of the second metal layer 220 on the substrate 100 can be set as a ring shape, and the orthographic projection of the second metal layer 220 on the substrate 100 surrounds the orthographic projection of the capacitor structure 300 on the substrate 100.

In this case, on the one hand, the ring-shaped second metal layer 220 may ensure the mechanical strength of the pad structure 200, on the other hand, the ring-shaped second metal layer 220 bears pressure in a wire bonding process, which can effective prevent the capacitor structure 300 surrounded by the ring-shaped second metal layer 220 from being damaged in a wire bonding process.

Moreover, the orthographic projection of the third metal layer 230 on the substrate 100 can be disposed to coincide with the orthographic projection of the second metal layer 200 on the substrate 100, which further enhances the effect of the second metal layer 230.

In an embodiment, the pad structure 200 is a power pad. At this time, as stated above, the pad structure 200 (specifically the fourth metal layer 240) can be electrically connected to the packaging substrate by making a lead, to acquire corresponding power voltage (such as VDDQ, VPP and VDD).

Therefore, at this time, the pad structure 200 is configured to input the power voltage to the chip circuit, as a power end of the chip circuit. The fourth metal layer 240 of the pad structure 200 receives a power signal on the packaging substrate, and inputs the power signal to the chip circuit through the third metal layer 230 and the second metal layer 220 in sequence.

Also, in the embodiment, the second metal layer 220 is electrically connected to the first metal layer 210 via a second through hole, and further electrically connected to the all sub-conductive portions 411. All the sub-conductive portions 411 are also electrically connected to the all of the capacitor devices 311 of the capacitor structure 300.

Therefore, one end of the capacitor structure 300 can be electrically connected to the pad structure 200 above the capacitor structure 300, to stabilize the power supply inputted by the pad structure 200.

In an embodiment, the pad structure 200 is a grounding pad. In this case, as stated above, the pad structure 200 (the fourth metal layer 240) can be electrically connected to the packaging substrate by making a lead, so as to be grounded.

Therefore, in this case, the pad structure 200 can be used as a grounding end of the chip circuit. The second metal layer 220, the third metal layer 230 and the fourth metal layer 240 of the pad structure 200 are electrically connected in sequence, and the pad structure 200 is electrically connected to the packaging substrate through the fourth mental layer 240, so as to be grounded.

Also, in the embodiment, the second metal layer 220 is also electrically connected to the first metal layer 210 via a second through hole, and further electrically connected to the all of the sub-conductive portions 411. All the sub-conductive portions 411 are also electrically connected to all the capacitor devices 311 of the capacitor structure 300.

Therefore, one end of the capacitor structure 300 can be effectively grounded, to stabilize the power supply inputted by the power end.

In practice, in other embodiments, the pad structure 200 may also not be a power pad and/or grounding pad. In this case, the power end and/or grounding end can be disposed in an external circuit outside the pad structure 200.

Alternatively, when the pad structure 200 is a power pad, the power end may also be disposed in the external circuit outside the pad structure 200. When the pad structure 200 is a grounding pad, the grounding end may also be disposed in the external circuit outside the pad structure 200, which is not limited in the disclosure.

It is to be understood that the external circuit outside the pad structure 200 refers to a circuit having no electrical connection relationship with the pad structure 200 in the chip circuit.

In an embodiment, the capacitor device 311 may include a transistor-type capacitor. Referring to FIG. 7, the gate 10 of the transistor-type capacitor forms the first polar plate 3111 of the capacitor device, and the source and the drain of the transistor-type capacitor and the corresponding parts of the substrate 100 form the second polar plate 3112 of the capacitor device. The first conductive portion 410 in a separated structure is electrically connected to the power end, and the second conductive portion 420 in the integrated structure is electrically connected to the grounding end.

Referring to FIG. 1, FIG. 2 and FIG. 3, the semiconductor structure may further include a protection ring 500. One end of the protection ring 500 is connected to the substrate 100, the other end of the protection ring 500 is connected to the second conductive portion 420, so as to be grounded through the second conductive portion.

Moreover, orthographic projection of the protection ring 500 on the substrate 100 surrounds orthographic projection of the capacitor structure 300 on the substrate 100. It is to be understood that FIG. 3 is a schematic diagram of a local structure of the semiconductor structure, so that only the right-side part in FIG. 3 shows the protection ring 500.

Therefore, in the embodiment, the protection ring 50 may effectively prevent the latch-up effect from occurring in the transistor-type capacitor.

Also, with disposing the protection ring 500, substrate parts of all the transistor-type capacitors as the second polar plates 3112 can be electrically connected to the second conductive portion 420 through the protection ring 500 in a unified manner.

Figure 8:
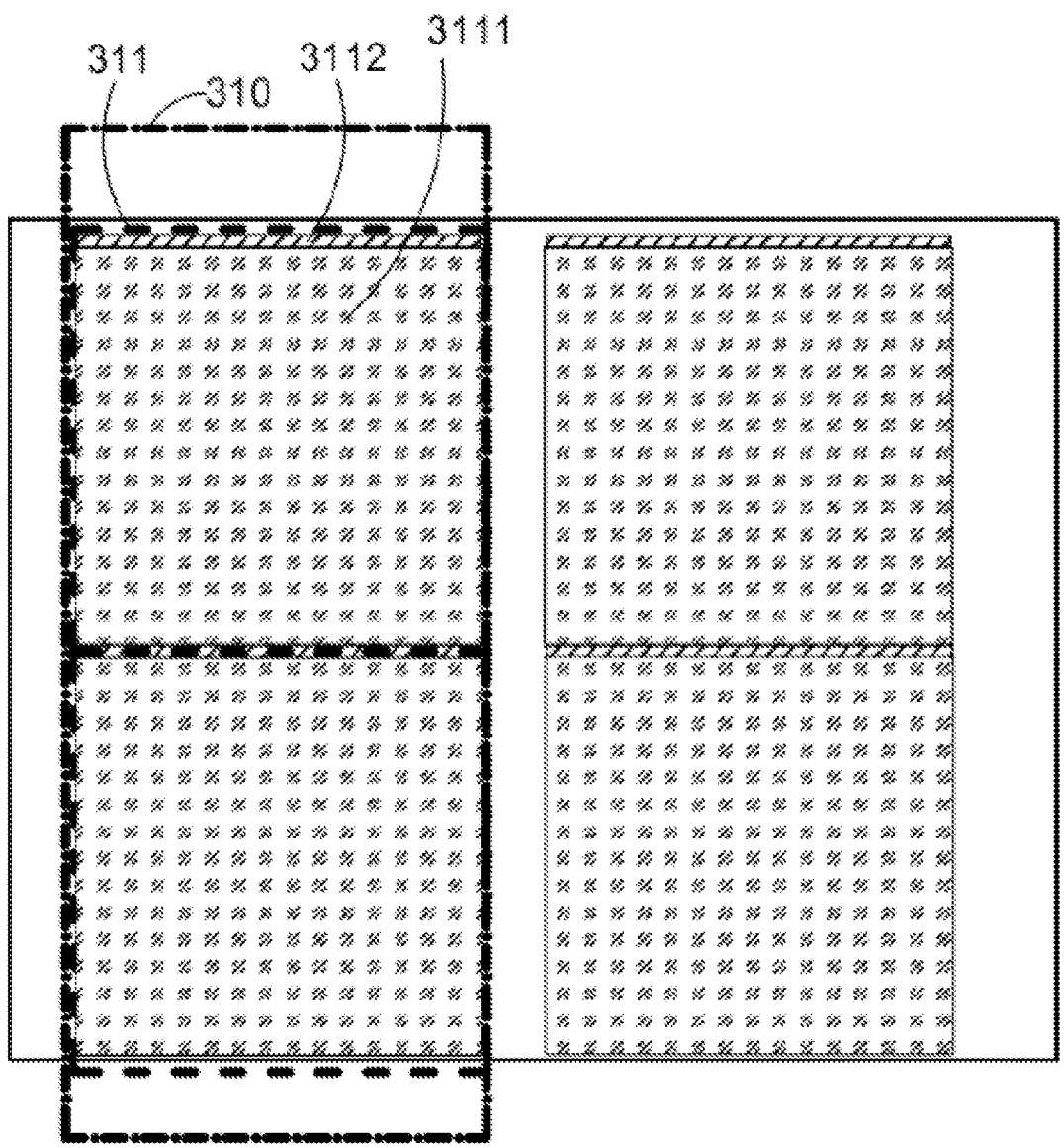
FIG. 8 is a schematic diagram of a capacitor structure in FIG. 3.

In an embodiment, referring to FIG. 3 and FIG. 8, the capacitor unit 310 may include at least two transistor-type capacitors, the adjacent two transistor-type capacitors in the same capacitor unit 310 share the source 20 or the drain 30.

In this case, when the area is fixed, a relatively large capacitance value can be generated.

In some implementations, the two adjacent transistor-type capacitors may also not share the source or the drain, which is not limited in the present disclosure.

In description of the specification, description of referring terms such as "some embodiments", "other embodiments" and "an embodiment" refers to that specific features, structures, materials or features described in combination with the embodiments or examples are involved in at least one embodiment or example of the disclosure. In the specification, schematic description on the above terms not always refers to same embodiments or example.

All the technical features of the above-mentioned embodiments may be combined freely. For simplicity of description, not all possible combinations of all the technical solutions in the above mentioned embodiments are described. However, any combination of these technical features shall fall within the scope recorded in the specification without conflicting.

The above mentioned embodiments only describe some implementation modes of the disclosure and are specifically described in detail, but are not understood as limits to the patent scope of the disclosure. It is to be pointed out that those of ordinary skill in the art may further make various transformations and improvements without departing from the concept of the disclosure and all of these shall fall within the scope of protection of the disclosure. Therefore, the scope of patent protection of the disclosure should be subject to the appended claims.

What is claimed is:

1. A semiconductor structure, comprising:
a pad structure disposed above a substrate; and
a capacitor structure which is disposed between the substrate and the pad structure, and is arranged to be opposite to the pad structure, and comprises at least two capacitor units connected in parallel and spaced apart from each other, wherein each of the capacitor units comprises at least one capacitor device;
wherein the capacitor device comprises a first polar plate and a second polar plate which are disposed oppositely, the semiconductor structure further comprises a conductive layer, the conductive layer comprises a first conductive portion and a second conductive portion which are mutually insulated, the first conductive portion is electrically connected to the first polar plates of all the capacitor devices; the second conductive portion is electrically connected to the second polar plates of all the capacitor devices, wherein one of the first conductive portion or the second conductive portion is also electrically connected to a power end, and the other of the first conductive portion or the second conductive portion is also electrically connected to a grounding end; and
wherein the second conductive portion is in an integrated structure and disposed across all the capacitor devices in the capacitor structure, and the first conductive portion is in a separated structure and comprises a plurality of conductive sub-portions which are mutually connected electrically, wherein the conductive sub-portion is disposed across the adjacent capacitor devices in the capacitor structure, and orthographic projections of all the conductive sub-portions on the substrate are spaced apart from orthographic projection of the second conductive portion on the substrate.

2. The semiconductor structure according to claim 1, wherein orthographic projection of the capacitor structure on the substrate is disposed within orthographic projection of the pad structure on the substrate.

3. The semiconductor structure according to claim 2, wherein a center of orthographic projection of the capacitor structure on the substrate coincides with a center of orthographic projection of the pad structure on the substrate.

4. The semiconductor structure according to claim 1, wherein a center of orthographic projection of the capacitor structure on the substrate coincides with a center of orthographic projection of the pad structure on the substrate.

5. The semiconductor structure according to claim 1, wherein each of the capacitor units comprises at least two capacitor devices disposed in parallel, the capacitor devices in the capacitor structure is disposed in M-row N-column array; and both M and N are integers greater than or equal to 2, and
the conductive sub-portion comprises a first sub-portion, and the same first sub-portion is disposed across the four capacitor devices which are adjacent in pairs and distributed in a center-symmetrical manner.

6. The semiconductor structure according to claim 5, wherein at least one of the power end or the grounding end is disposed in an external circuit outside the pad structure.

7. The semiconductor structure according to claim 1, wherein the pad structure comprises a first metal layer, one end of the first metal layer is electrically connected to the power end or the grounding end, and the other end of the first metal layer is electrically connected to the all the conductive sub-portions via a first through hole.

8. The semiconductor structure according to claim 7, wherein the pad structure further comprises a second metal layer, a third metal layer and a fourth metal layer, wherein the third metal layer is connected with the second metal layer via a third through hole, and the fourth metal layer is connected with the third metal layer via a fourth through hole.

9. The semiconductor structure according to claim 8, wherein a shape of orthographic projection of the second metal layer on the substrate is a ring shape, and the orthographic projection of the second metal layer on the substrate surrounds orthographic projection of the capacitor structure on the substrate.

10. The semiconductor structure according to claim 9, wherein orthographic projection of the third metal layer on the substrate coincides with the orthographic projection of the second metal layer on the substrate.

11. The semiconductor structure according to claim 10, wherein the pad structure is a power pad or a grounding pad, and the second metal layer is electrically connected to the first metal layer via a second through hole.

12. The semiconductor structure according to claim 9, wherein the pad structure is a power pad or a grounding pad, and the second metal layer is electrically connected to the first metal layer via a second through hole.

13. The semiconductor structure according to claim 8, wherein the pad structure is a power pad or a grounding pad, and the second metal layer is electrically connected to the first metal layer via a second through hole.

14. The semiconductor structure according to claim 1, wherein at least one of the power end or the grounding end is disposed in an external circuit outside the pad structure.

15. The semiconductor structure according to claim 1, wherein at least one of the power end or the grounding end is disposed in an external circuit outside the pad structure.

16. The semiconductor structure according to claim 1, wherein the capacitor device comprises a transistor-type capacitor, a gate of the transistor-type capacitor forms the first polar plate of the capacitor device, and a source and a drain of the transistor-type capacitor and the substrate form the second polar plate of the capacitor device.

17. The semiconductor structure according to claim 16, wherein the first conductive portion is electrically connected to the power end, and the second conductive portion is electrically connected to the grounding end;
the semiconductor structure further comprises a protection ring, two ends of the protection ring are respectively connected to the substrate and the second conductive portion, and orthographic projection of the protection ring on the substrate surrounds orthographic projection of the capacitor structure on the substrate.

18. The semiconductor structure according to claim 16, wherein the capacitor unit comprises at least two transistor-type capacitors, and the two adjacent transistor-type capacitors in a same capacitor unit share the source or the drain.

* * * * *